United States Patent [19]

Mawatari et al.

[11] Patent Number: 5,446,564
[45] Date of Patent: Aug. 29, 1995

[54] LIQUID CRYSTAL DISPLAY DEVICE HAVING PHOTOSENSOR AT EACH PIXEL

[75] Inventors: Atsushi Mawatari, Hamura; Minoru Kanbara, Hachioji, both of Japan

[73] Assignee: Casio Computer Co., Ltd., Tokyo, Japan

[21] Appl. No.: 71,200

[22] Filed: Jun. 2, 1993

[30] Foreign Application Priority Data

Jun. 3, 1992 [JP] Japan .................. 4-142901

[51] Int. Cl.⁶ .................. G02F 1/135; G09G 1/28
[52] U.S. Cl. .................. 359/72; 359/59; 345/104
[58] Field of Search .......... 359/60, 72, 58, 59; 345/90, 91, 92, 104, 173, 175, 179, 205, 206, 207

[56] References Cited

U.S. PATENT DOCUMENTS

| 4,577,189 | 3/1986 | Adolfsson et al. | 345/207 |
| 4,655,552 | 4/1987 | Togashi et al. | 359/60 |
| 4,687,298 | 8/1987 | Aoki et al. | 359/59 |
| 4,952,031 | 8/1990 | Tsunoda et al. | 359/72 |

FOREIGN PATENT DOCUMENTS

| 0394044A2 | 10/1990 | European Pat. Off. |  |
| 0411325A2 | 2/1991 | European Pat. Off. |  |
| 0482564A2 | 4/1992 | European Pat. Off. |  |
| 2-251825 | 10/1990 | Japan . |  |
| 2233469 | 1/1991 | United Kingdom | 345/90 |

*Primary Examiner*—Anita Pellman Gross
*Assistant Examiner*—Walter J. Malinowski
*Attorney, Agent, or Firm*—Frishauf, Holtz, Goodman, Langer & Chick

[57] ABSTRACT

A liquid crystal display device in which TFTs and liquid crystal (LC) capacitances are connected in series between data lines and a common electrode, and photoelectric conversion elements are connected in parallel to the LC capacitances.

11 Claims, 3 Drawing Sheets

LIQUID CRYSTAL DISPLAY DEVICE HAVING PHOTOSENSOR AT EACH PIXEL

BACKGROUND OF THE INVENTION

1. Field of the Invention

The present invention relates to a liquid crystal display (LCD) device having a photosensor to which information is input by light radiation.

2. Description of the Related Art

There is known a photosensor to which image information is input by light radiation. Photosensors include semiconductor photovoltaic elements such as photodiodes and phototransistors, and photoconductive elements having a resistance variable due to light radiation. A CCD (Charge-Coupled Device) is well known as a charge transfer system having functions of photoelectric conversion, charge-accumulation and scan. Although the CCD is capable of transferring charge without a switching element, it is necessary to use a semiconductor substrate. Thus, the CCD cannot be formed on an insulating substrate such as a glass substrate.

On the other hand, an active matrix-type LCD device is known as a display device. In this display device, a liquid crystal is sealed between a pair of glass substrates. One of the glass substrates is provided with a plurality of data lines and a plurality of access lines. The data lines intersect the access lines at right angles. Each intersection of these lines is provided with a pixel electrode and a non-linear active element for connecting the associated data line and access line.

As stated above, there are conventionally known an image input device and an image display device, each of which is constituted as an individual element. If these individual devices are used to manufacture an electronic apparatus having input and display functions, the size of the apparatus becomes large and the portability of the apparatus deteriorates. Since each device has a switching element associated with each photodetector or each display electrode, the electronic apparatus having input/output functions must have double the number of switching elements, and the manufacturing cost increases.

SUMMARY OF THE INVENTION

The object of the present invention is to provide a liquid crystal display device having both functions of inputting data by means of light radiation and displaying the input data.

According to the present invention, there is a liquid crystal display device comprising:

a pair of insulating substrates arranged in parallel with a gap provided between mutually facing surfaces of the insulating substrates, at least one of the insulating substrates being transparent;

a liquid crystal filled in the gap between the insulating substrates;

an access line formed on that surface of one of the insulating substrates, which faces the other insulating substrate;

a plurality of data lines formed on that surface of said one of the insulating substrates, which faces the other insulating substrate;

a plurality of display pixel elements for applying an electric field to the liquid crystal, the display pixel elements being arranged in accordance with the data lines;

switching means, connected to the access line, to the data lines, and to the display pixel elements, for switching a connection between the display pixel elements and the data lines;

a common electrode formed on a surface of said other insulating substrate which faces the liquid crystal and which faces said one of the insulating substrates; and a plurality of photosensors each connected in parallel to one display pixel element and each photosensor having an output terminal which is connected to the switching means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENT

Figure 1:
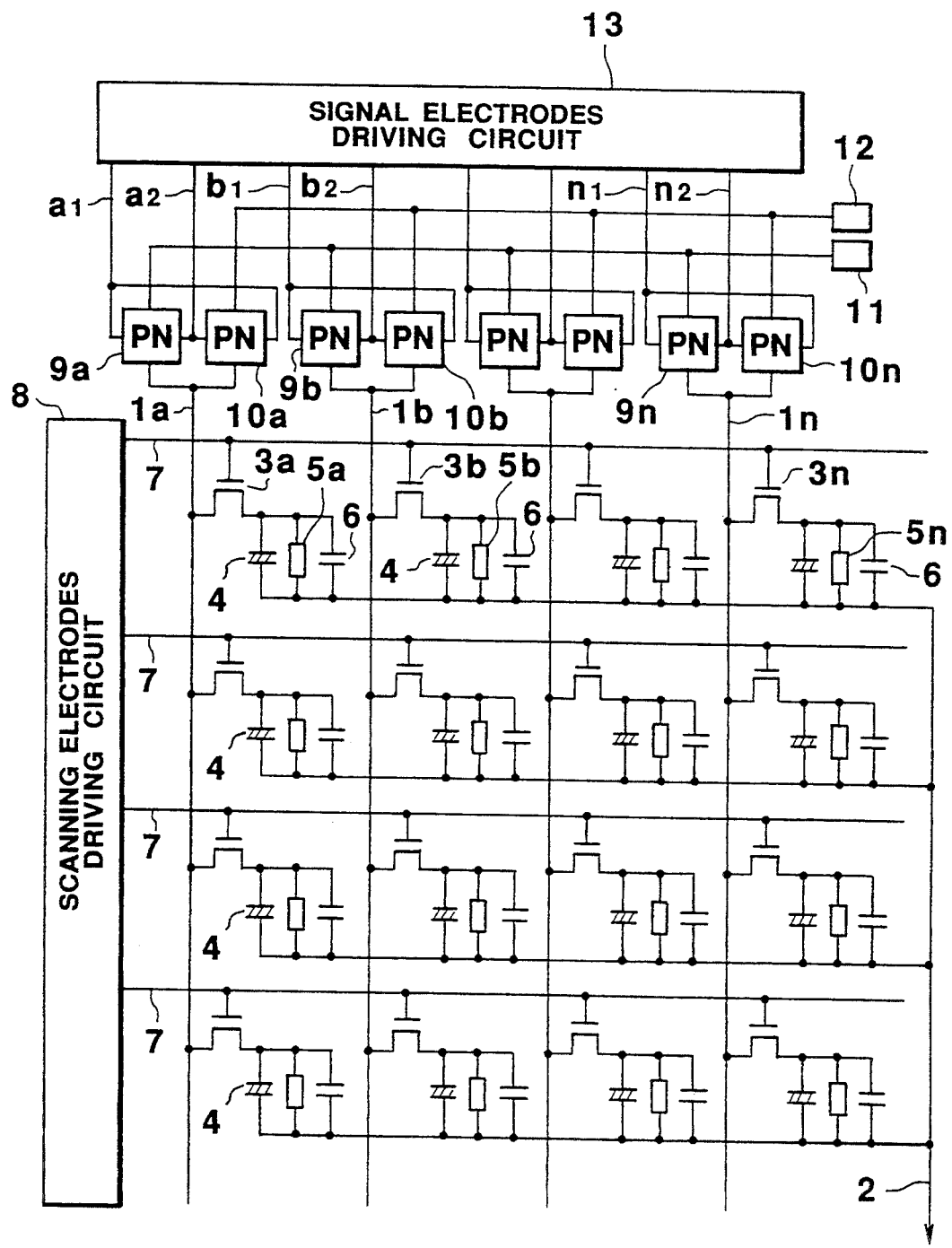
FIG. 1 is a circuit diagram of a liquid crystal display (LCD) device with a photosensor according to a first embodiment of the invention.

FIG. 1 is a circuit diagram showing a first embodiment of the present invention. N-channel MOS TFTs (Thin Film Transistor) $3a$, $3b$, ..., $3n$ and liquid crystal (LC) capacitances 4 are connected in series between signal lines $1a$, $1b$, ..., $1n$ and a liquid crystal (LC) common electrode 4. Photoelectric converter elements $5a$, $5b$, ..., $5n$ and auxiliary capacitances 6 are connected in parallel to the LC capacitances 4. The gate of each of TFTs $3a$, $3b$, ..., $3n$ is connected to a corresponding one of gate lines 7. The gate lines 7 are connected to a scan-electrode driving circuit 8 comprising a shift register or the like. One pixel is constituted by each TFT $3a$, $3b$, ..., $3n$, each LC capacitance (display pixel element) 4, each photoelectric converter element (photosensor) $5a$, $5b$, ..., $5n$, and each auxiliary capacitance 6. A plurality of pixels are connected to the signal lines $1a$, $1b$, ..., $1n$ and gate lines 7 so as to form a matrix. The signal lines are connected to first data terminals of first transfer gates $9a$, $9b$, ..., $9n$ and to first data terminals of second transfer gates $10a$, $10b$, ..., $10n$. Second data terminals of the first transfer gates $9a$, $9b$, ..., $9n$ are connected to display data input terminals 11, and second data terminals of the second transfer gates $10a$, $10b$, ..., $10n$ are connected to read-out data output terminals 12. P-side control terminals of the first transfer gates $9a$, $9b$, ..., $9n$ and N-side control terminals of the second transfer gates $10a$, $10b$, ..., $10n$ are connected commonly to a signal-electrodes driving circuit 13 comprising a shift register through lines a1, b1, ..., n1. N-side control terminals of the first transfer gates 9a, 9b, ..., 9n and P-side control terminals of the second transfer gates 10a, 10b, ...,10n are connected commonly to the signal-electrodes driving circuit 13 through lines a2, b2, ..., n2. The first and second transfer gates 9a, 9b, ... 9n and 10a, 10b, ..., 10n are constituted by, e.g. CMOS TFTs. Each transfer gate is turned on and opened when a low potential is applied to the P-side control terminal and a high potential is applied to the N-side control terminal.

A photodiode or a phototransistor can be used as the photoelectric converter element 5. Light having a main component of infrared wavelength is emitted from a light source and radiated on an original sheet, and the reflected light is input to the photoelectric converter element 5. In other cases, a picture or character input by an infrared input pen is received by the photo-electric converter element 5, and a photoelectric current corresponding to the intensity of input light is produced.

The operation for reading optical image data will now be described.

In reading out data, an input light source (not shown) is turned on, and light representing input data is radiated on a predetermined pixel. In this state, the scan-electrode driving circuit 8 is actuated, and thus a gate signal is supplied to the first gate line 7 (uppermost gate line), thereby turning on the TFTs 3a, 3b, ..., 3n having their gates connected to the first gate line 7. At this time, a low-level signal is output from the signal-electrodes driving circuit 13 to the line a2, and high-level signals are supplied to the other lines a1, b1, b2, ..., n1, n2. Thus, only one 10a of the second transfer gates is turned on, and the other second transfer gates 10b, ..., 10n and the first transfer gates 9a, 9b, ..., 9n are turned off. Accordingly, a photovoltaic-effect current generated by the photoelectric converter element 5a is output to the read-out data output terminal 12 via the second transfer gate 10a. Then, a low-level signal is output from the signal-electrodes driving circuit 13 to the line b2, and high-level signals are supplied to the other lines a1, a2, b1, ..., n1, n2, whereby only the second transfer gate 10b is turned on and the other second transfer gates 10a, 10b,...,10n and the first transfer gate 9a,... , 9n are turned off. Accordingly, a photovoltaic-effect current generated by the photoelectric converter element 5b is output to the read-out data output terminal 12 via the second transfer gate 10b. Similarly, photovoltaic-effect currents generated by the other photoelectric converter elements are successively output to the read-out data output terminal 12 via the second transfer gates. After the data has been read out from the photoelectric converter elements 5a to 5n connected to the first gate line 7, photoelectric currents generated in the photoelectric converters connected to the second and third gate lines are similarly read out. Since this operation is clear from the above description, a description thereof may be omitted. A photoelectric current output from each photoelectric converter element to the read-out data terminal in the above-described read mode is A/D converted and stored in an image memory (not shown).

The operation for displaying images will now be described. The scan-electrode driving circuit 8 is activated, and a gate signal is supplied to the first gate line 7 (uppermost line), and the TFTs 3a, 3b, ..., 3n connected to this gate line 7 are turned on. At this time, a low-level signal is output to the line a1 from the signal-electrodes driving circuit 13, and high-level signals are supplied to the other lines a2, b1, b2, ..., n1, n2. Thus, only the first transfer gate 9a is turned on and the other first transfer gates 9b, ..., 9n and second transfer gates 10a, 10b, ...,10n are turned off. Accordingly, if the image data stored in the image memory (not shown) is output to the display data input terminal 11, the image data is supplied to the signal line 1a via the first transfer gate 9a. At this time, since the TFT 3a is turned on, the LC capacitance 4 and auxiliary capacitance 6 are charged with a voltage corresponding to the image data. The photoelectric converter element 5a has a high impedance when light is not radiated, the display operation is not influenced. Then, a low-level signal is output from the signal-electrodes driving circuit 13 to the line b1, and high-level signals are supplied to the other lines a1, a2, b2, ..., n1, n2. Thus, only the first transfer gate 9b is turned on, and the other first transfer gates 9a, ..., 9n and second transfer gates 10a, 10b, ..., 10n are turned off. Accordingly, the image data supplied to the display data input terminal 11 from the image memory (not shown) is supplied to the signal line 1b via the first transfer gate 9b. After the LC capacitances 4 and auxiliary capacitances 6 connected to the first gate line 7 have been charged, the LC capacitances 4 and auxiliary capacitances 6 connected to the second and following gate lines 7 are similarly charged with image data. In this manner, the same display operation as in a regular active-matrix type LCD device can be performed.

The entire circuit shown in FIG. 1 is formed on one of the insulating substrates of the LCD device having the photosensor which will be described below.

Figure 2:
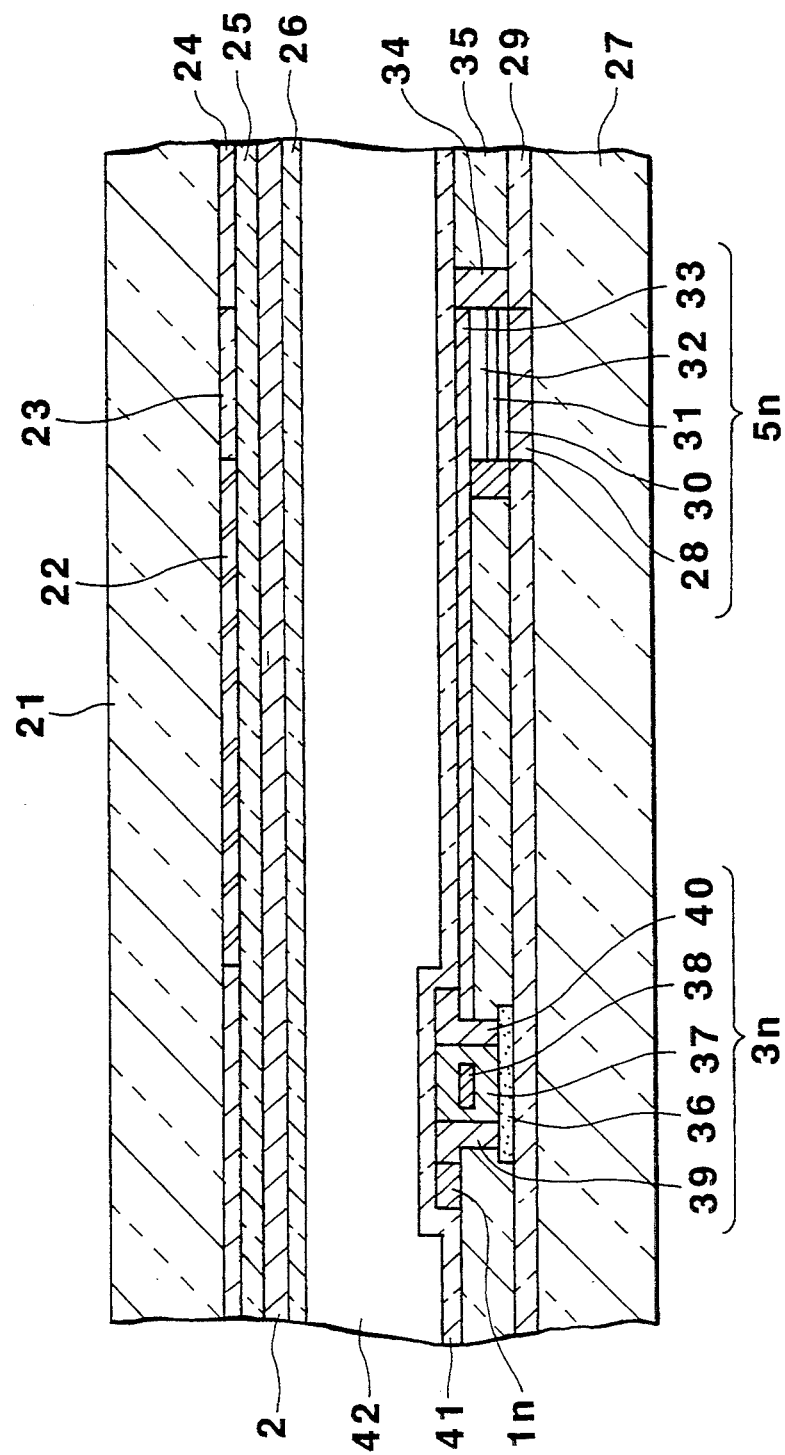
FIG. 2 is an enlarged cross-sectional view showing the structure of a main part of the circuit shown in FIG. 1.

FIG. 2 is an enlarged cross-sectional view showing examples of the TFT 3n and photoelectric converter element 5n of the LCD device of the present invention. A red, blue or green color filter 22, a transparent insulating film 23 and an opaque insulating film 24 are formed in a predetermined pattern on one surface of a first transparent glass substrate 21. A transparent insulating film 25 and a common electrode 2 are successively laminated on the color filter 22, the transparent insulating film 23 and the opaque insulating film 24. An orientation film 26 is laminated on the common electrode 2. On the other hand, an opaque anode electrode 28 and an insulating film 29 are formed on one surface of a second transparent glass substrate 27, which faces the first glass substrate 21. An n+-conductivity type a-Si (amorphous silicon) layer 30, an i-conductivity type a-Si (intrinsic amorphous silicon) layer 31 and a p+-conductivity type a-Si layer 32 are successively laminated on the anode electrode 28. A transparent cathode electrode 33 is laminated on the p+-a-Si layer 32. An opaque insulating layer 34 is formed to surround the outer faces of the cathode electrode 33, n+-a-Si layer 30, i-a-Si layer 31 and p+-a-Si layer 32, except an extending portion of the cathode electrode 33. An insulating film 35 and a silicon thin film 36 are laminated in a predetermined pattern on the insulating film 29. An opaque insulating film 37, a gate electrode 38, a drain electrode 39 and a source electrode 40 are laminated in a predetermined pattern on the silicon thin film 36. The source electrode 40 is electrically connected to the extending portion of the cathode electrode 33. An orientation film 41 is laminated on the surface of the laminated structure on the second glass substrate 27. The signal line 1n is connected to the drain electrode 39. The orientation film 26 of the first glass substrate 21 and the orientation film 41 of the second glass substrate 27, which have the above structures, are opposed to each other at a predetermined distance. A liquid crystal 42 is filled between the orientation films 26 and 41. The anode electrode 28, n+-a-Si layer 30, i-a-Si layer 31, p+-a-Si layer 32 and cathode electrode 33 constitute the photoelectric converter element or a-Si photodiode 5n. The silicon thin film 36, opaque insulating film 37, gate electrode 38, drain electrode 39 and source electrode 40 constitute the TFT 3n.

In the above structure, when optical image data is read out, light is radiated on the photoelectric converter element 5n while a reverse bias is applied across the cathode electrode 33 and anode electrode 28 of the converter element 5n. Electrons appearing at the p+-a-Si layer 32 due to light radiation shift to the n+-a-Si layer 30, and holes appearing at the n+-a-Si layer 30 shift to the p+-a-Si layer 32. Thereby, an electric current begins to flow from the anode electrode 28 to the cathode electrode 33, and the TFT 3n is turned on. As a result, the photoelectric current flows from the source electrode 40 to the drain electrode 39.

Figure 3:
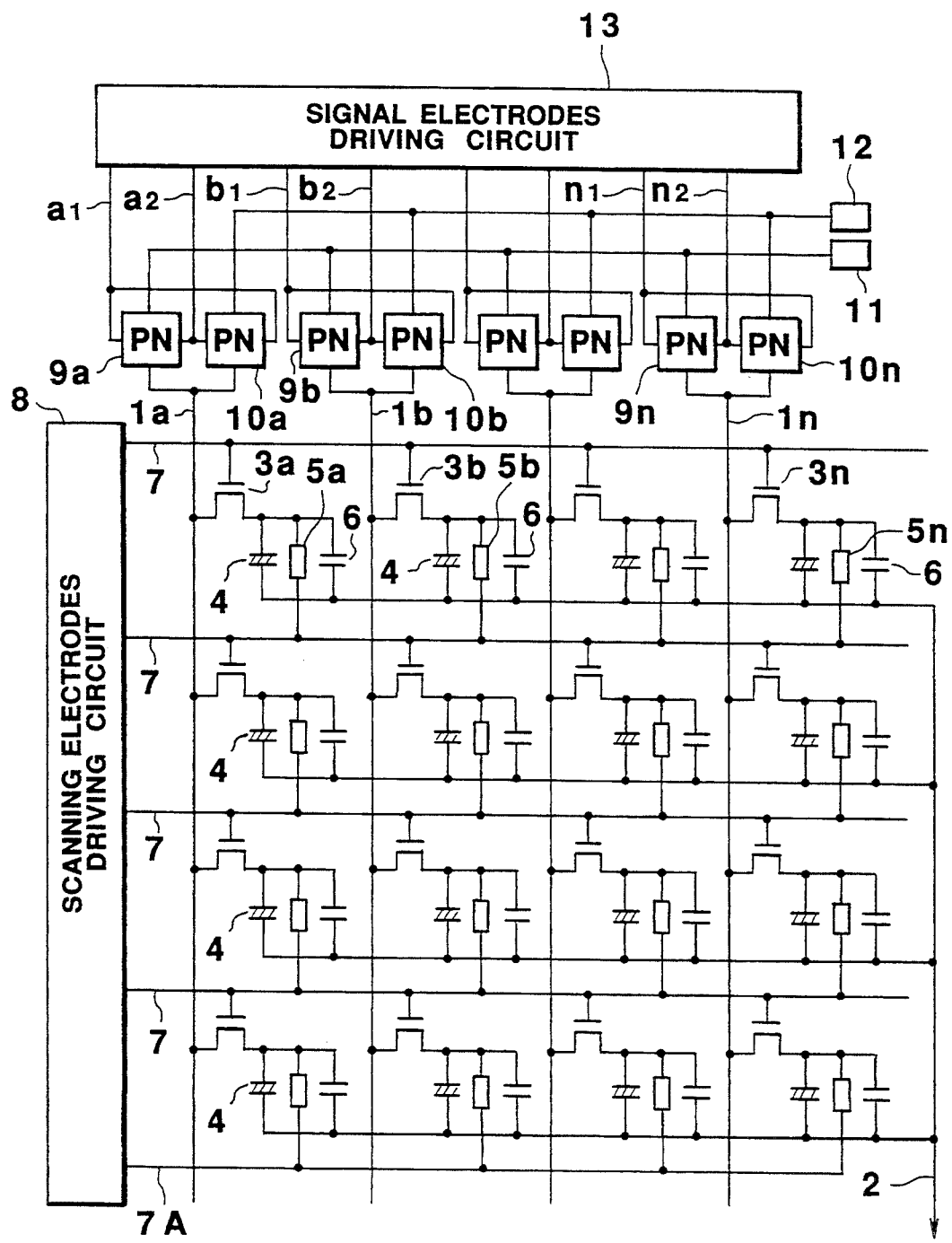
FIG. 3 is a circuit diagram showing the structure of an LCD device according to a second embodiment of the invention.

FIG. 3 is a circuit diagram showing the structure of an LCD device according to a second embodiment of the invention.

The second embodiment differs from the first embodiment in that the anode electrode of each photoelectric conversion element 5a, 5b, . . . , 5n is connected to an adjacent gate line 7, and not to a common line of cathode-side terminals of LC capacitance 4 and auxiliary capacitance 6. The anode electrodes of the photoelectric conversion elements in the last row are connected to a dummy line 7A formed in parallel to the gate lines 7. With the exception of this point, the second embodiment is identical to the first embodiment. The parts in the second embodiment, which are common to those in the first embodiment, are denoted by like reference numerals, and a description thereof is omitted. Regarding the second embodiment, a description will now be given of the operation for reading optical image data from the photoelectric converter elements 5a, 5b, . . . , 5n connected to the first gate line 7. An access signal is supplied to the gate line 7 to turn on the TFTs 3a, 3b, . . . , 3n, and a negative potential is applied to the cathode electrodes of the photoelectric converter elements 5a, 5b, . . . , 5n. At the same time, a non-selection (ground) potential is supplied to the gate lines 7 of the other rows. Thereby, the photoelectric converter elements 5a, 5b, . . . , 5n are set in the reverse bias state. In this state, light is radiated. Since the gate lines 7 of the other rows are at the non-selection (ground) potential level, the photoelectric current produced in the photoelectric converter element 5a, 5b, . . . , 5n can be sequentially read out via the TFT 3a, 3b, . . . , 3n.

As has been described above, the LCD panel device according to the present invention has photosensors arranged at the respective pixel regions of the device. Thus, the electronic apparatus having both optical image input function and image display function can be remarkably reduced in size. In addition, since each photoelectric converter element and pixel electrode selection switch element are commonly used, the structure of the device is simplified and the device can be manufactured at low cost with a high yield.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A liquid crystal display device comprising:
   a pair of insulating substrates arranged in parallel with a gap provided between mutually facing surfaces of the insulating substrates, at least one of the insulating substrates being transparent;
   a liquid crystal filled in the gap between the mutually facing surfaces of the insulating substrates;
   an access line formed on a first surface of one of the insulating substrates, which faces the other insulating substrate;
   a plurality of data lines formed on said first surface of said one of the insulating substrates, which faces the other insulating substrate;
   a plurality of display pixel elements arranged to apply an electric field to the liquid crystal, said display pixel elements being arranged in accordance with said data lines;
   switching means, connected to the access line, to the data lines, and to the display pixel elements, for switching a connection between the display pixel elements and the data lines;
   a common electrode formed on a surface of said other insulating substrate which faces the liquid crystal and which faces said one of the insulating substrates; and
   a plurality of photosensors each connected in parallel to one display pixel element and each photosensor having an output terminal which is connected to said switching means.

2. The device according to claim 1, wherein each of said photosensors comprises a diode.

3. The device according to claim 1, wherein said photosensors each have another terminal which is connected to the common electrode.

4. The device according to claim 1, wherein said switching means comprises a thin film transistor (TFT).

5. The device according to claim 1, wherein each of said plurality of data lines has two branch lines connected respectively to transfer gates.

6. The device according to claim 5, wherein:
   one of said branch lines is connected to a read-out data output terminal via an associated transfer gate, and
   another of said branch lines is connected to a display data input terminal via the associated transfer gate.

7. A liquid crystal display device comprising:
   a pair of insulating substrates arranged in parallel with a small gap provided between mutually facing surfaces of the insulating substrates, at least one of the insulating substrates being transparent;
   a liquid crystal filled in the gap between the mutually facing surfaces of the insulating substrates;
   a plurality of access lines formed on a first surface of one of the insulating substrates, which faces the other insulating substrate;
   a plurality of data lines formed to extend in a direction perpendicular to said access lines;
   a plurality of display pixel elements arranged to apply an electric field to the liquid crystal, said display pixel elements being arranged in the vicinity of intersections of the access lines and the data lines;
   switching means, connected to the access lines, to the data lines, and to the display pixel elements, for switching a connection between the display pixel elements and the data lines;

a common electrode formed on a surface of said other insulating substrate which faces the liquid crystal and which faces said one of the insulating substrates; and a plurality of photosensors each connected in parallel to one display pixel element and each photosensor having an output terminal which is connected to said switching means.

8. The device according to claim 7, wherein said photosensors each have another terminal which is connected to the common line electrode.

9. The device according to claim 7, wherein each of said plurality of data lines has two branch lines connected to transfer gates.

10. The device according to claim 9, wherein:

one of said branch lines is connected to a read-out data output terminal via an associated transfer gate, and another of said branch lines is connected to a display data input terminal via the associated transfer gate.

11. A liquid crystal display device comprising:

a pair of insulating substrates arranged in parallel with gap provided between mutually facing surfaces of the insulating substrates, at least one of the insulating substrates being transparent;

a liquid crystal filled in the gap between the mutually facing surfaces of the insulating substrates;

a plurality of access lines formed on a first surface of one of the insulating substrates, which faces the other insulating substrate;

a plurality of data lines formed to extend in a direction perpendicular to said access lines;

a plurality of display pixel elements arranged to apply an electric field to the liquid crystal, said display pixel elements being arranged in the vicinity of intersections of the access lines and the data lines;

switching means, connected to the access lines, to the data lines, and to the display pixel elements, for switching a connection between the display pixel elements and the data lines;

a common electrode formed on a surface of said other insulating substrate which faces the liquid crystal and which faces said one of the insulating substrates; and a plurality of photosensors, each having one electrode and another electrode, said one electrode of each photosensor being connected to one of said display pixel elements and said another electrode of each photosensor being connected to an adjacent one of said access lines.

* * * * *